United States Patent [19]

Brian

[11] Patent Number: 4,565,993
[45] Date of Patent: Jan. 21, 1986

[54] DYNAMIC STROBE TIMING CIRCUITRY FOR A/D CONVERSION APPARATUS

[75] Inventor: Michael Brian, Garland, Tex.

[73] Assignee: Rockwell International Corporation, El Segundo, Calif.

[21] Appl. No.: 623,738

[22] Filed: Jun. 22, 1984

[51] Int. Cl.[4] .............................................. H03M 1/12
[52] U.S. Cl. ...................... 340/347 AD; 340/347 SH; 307/352; 328/151
[58] Field of Search ....................... 328/151; 358/138; 340/347 SH; 307/352, 353

[56] References Cited

U.S. PATENT DOCUMENTS 4,291,299  9/1981  Hinz et al. ........................... 358/138
4,393,371  7/1983  Morgan-Smith .................... 328/151

Primary Examiner—L. T. Hix
Assistant Examiner—David M. Gray
Attorney, Agent, or Firm—Bruce C. Lutz; V. L. Sewell; H. Fredrick Hamann

[57] ABSTRACT

If the timing of detection of an analog signal, by an A/D converter, with respect to its theoretical value is optimum, the most significant error bit output by the A/D converter will integrate to a zero value. The present invention takes the information indicative of the most recent history of amplitude variation of the analog signal to logically modify (affect polarity) the most significant error bit and apply it to an integrator. The integrated value is used to adjust a variable time delay clock circuit use in determining the detection time in the A/D converter.

5 Claims, 4 Drawing Figures

DYNAMIC STROBE TIMING CIRCUITRY FOR A/D CONVERSION APPARATUS

THE INVENTION

The present invention is related generally to electronics and more specifically to A/D (analog-to-digital) signal conversion. Even more specifically, the invention is related to a circuit for dynamically altering the time of application of a clock to an A/D converter circuit for the purpose of optimizing the accuracy of signal detection where the signal being detected is a multilevel as opposed to a two level signal to be analog-to-digital converted.

BACKGROUND

As the frequency of operation of communications equipment gets higher and higher, and as more and more data needs to be transmitted, the requirements on the detection and demodulation equipment increase. Further, when multilevel signals, as opposed to binary signals, need to be detected, more problems in accurate detection of bit information are introduced. When the communications equipment is transmitting data, as contrasted with voice information, the bit error rate must be very low. The radio which incorporates the present invention, required two separate data streams which had to be delay matched. If the two data streams were not accurately delay matched, the bit error rate at the output would rise to unacceptable levels. The present invention, therefore, was designed to provide a dynamic timing adjustment whereby the analog-to-digital conversion would take place at the optimal time or at a time that would cause the "eye" of an oscilloscope presentation of the analog signal to be maximum. The present invention accomplishes the adjustment by utilizing the most significant error bit (next most significant bit output by the A/D converter and not used as part of the digitally converted word), adjusts its polarity in view of the most recent history of amplitude variation of the incoming analog signal to be converted and uses this logically modified signal in an integrator circuit to adjust the amount of time delay of a clock signal to either lessen or increase the delay to adjust the clock signal toward the optimal action triggering conversion point.

It is therefore an object of the present invention to provide a dynamic timing adjustment circuit for a multilevel analog signal A/D converter.

Other objects and advantages of the present invention may be ascertained from a reading of the specification and appended claims in conjunction with the drawings wherein:

FIG. 1 is a block diagram of the inventive concept;
FIG. 2 is a detailed block diagram of the circuit of FIG. 1;
FIG. 3 is a timing diagram used to explain the operation of FIGS. 1 and 2; and
FIG. 4 illustrates an alternate circuit that may be used to accomplish trajectory detection from that illustrated in FIG. 2.

DETAILED DESCRIPTION

Figure 1:
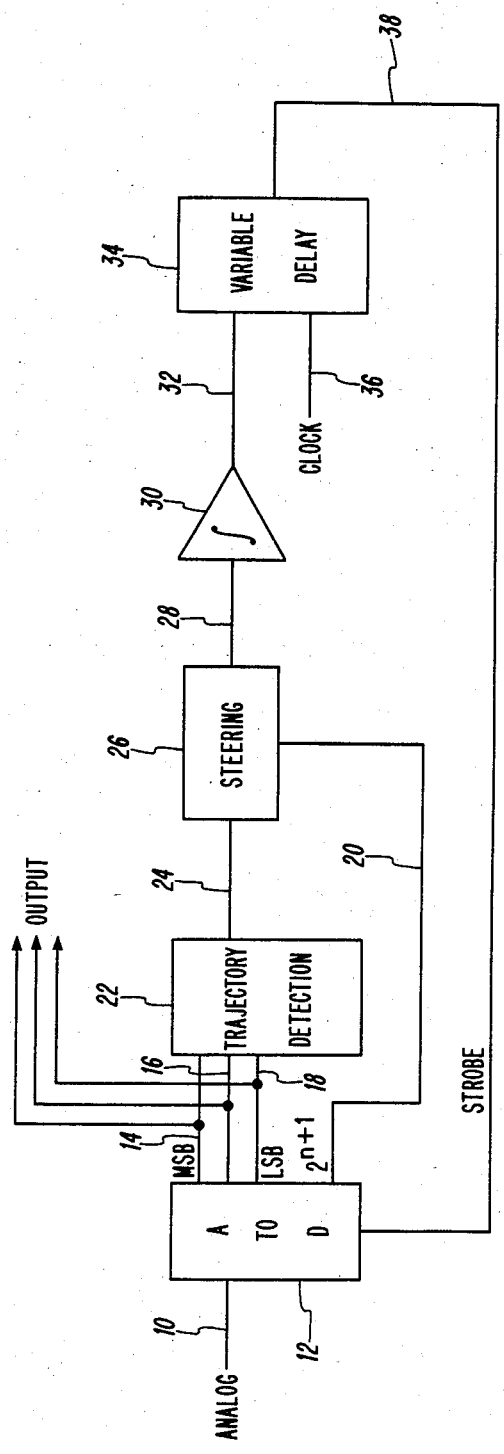

In FIG. 1 an analog input signal is supplied on lead 10 to an analog-to-digital converter 12 having a plurality of digital output leads 14, 16, 18 and 20. The leads 14 through 18 are the least significant bit through most significant bit of the converted signals that are utilized for output to further circuitry. The lead 20 is defined herein as the most significant error bit lead and supplies the next most significant bits after the bits supplied on lead 18. The leads 14 through 18 are supplied to a trajectory or slope detection block 22 which provides an output signal on a lead 24 to a steering or logic block 26. The lead 20 is also supplied to steering block 26. An output of steering block 26 is supplied on a lead 28 to an integrator 30. The integrator 30 provides signals on a lead 32 to a variable delay block 34. Block 34 also receives clock input signals on a lead 36 and supplies output signals in the form of a delayed clock on a lead 38 to the strobe or clock input of A/D converter 12.

Figure 2:
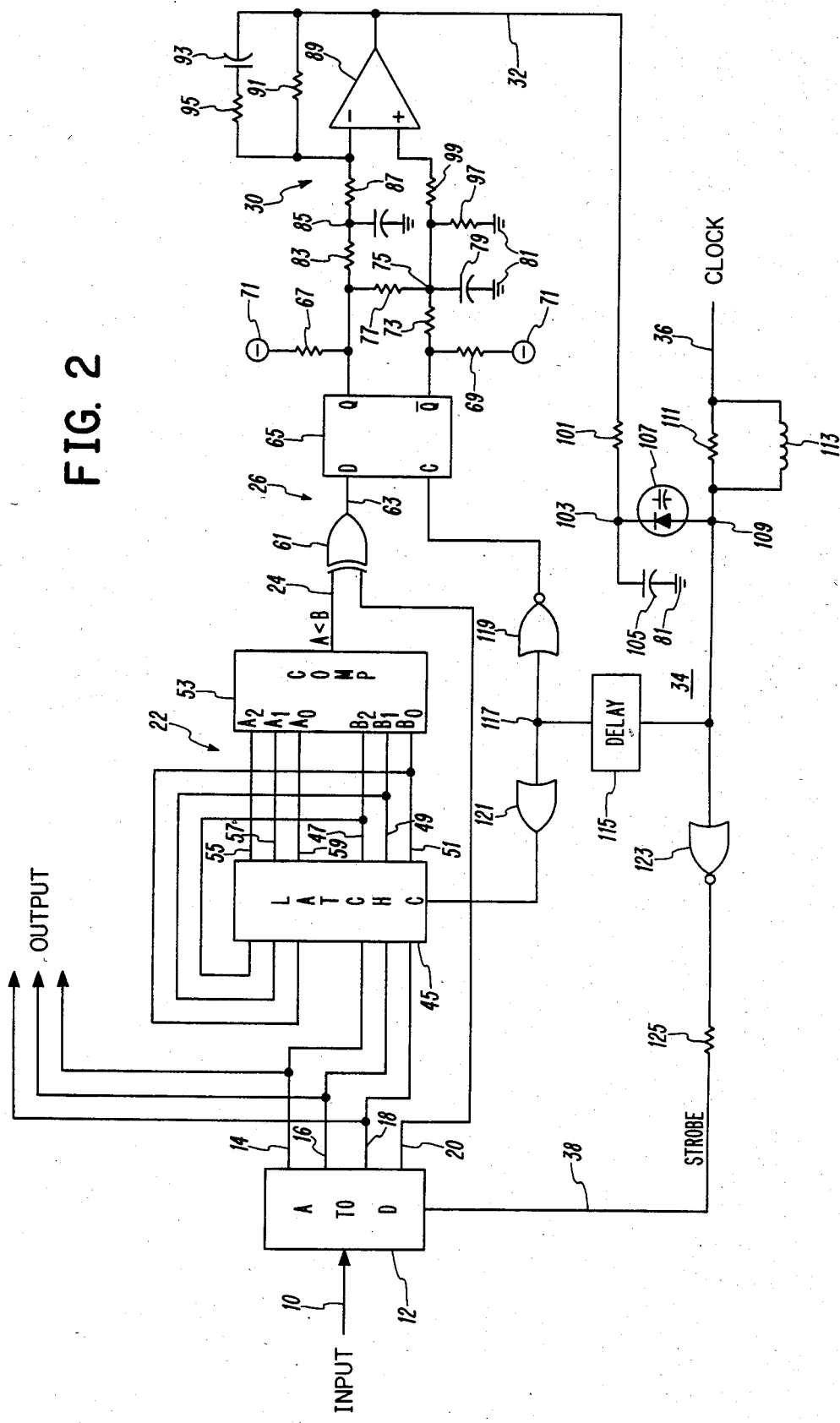

In FIG. 2 the same numbers as used in FIG. 1 are used where applicable. As illustrated, the leads 14 through 18 are applied to a latch block 45 within the slope detection portion 22. Signals input to latch 45 on leads 14 through 18 are output on a set of leads 47, 49 and 51 to a comparator 53 and also supplied to a second input of latch 45. The second set of input signals is supplied at the next clock on output leads 55, 57 and 59 to comparator 53. Comparator 53 compares the amplitude of the two digital signals appearing on the sets of leads 47 through 51 and 55 through 59 and provides an output signal on lead 24 if the B digital word is larger than the A digital word. In one embodiment of the invention, the block 45 was a 10176 whereas the comparator 53 was a 10166. Both of these blocks are standard microcircuit blocks and can be purchased from any of several companies such as Motorola. The signals from leads 20 and 24 are supplied to an exclusive OR gate 61 which supplies output signals on a lead 63 to a D input of a D flip-flop 65. The Q and $\overline{Q}$ outputs of D flip-flop 65 are connected through resistors 67 and 69, respectively, to a negative power supply 71. The $\overline{Q}$ output is also connected through a resistor 73 to a junction point 75. A resistor 77 is connected between the Q output and junction point 75. A capacitor 79 is connected between junction point 75 and ground 81. A resistor 83 is connected between the Q output of D flip-flop 65 and a junction point 85. A resistor 87 is connected between junction point 85 and an inverting or minus input of an integrating amplifier 89 used in the integrating circuit 30. A feedback resistor 91 is connected from the output of amplifier 89 back to the inverting input. A capacitor 93 and a resistor 95 are connected in parallel with resistor 91. A resistor 97 is connected between junction point 75 and ground 81 while a resistor 99 is connected between junction point 75 and the positive or non-inverting input of amplifier 89. The output of amplifier 89 is labeled 32 as shown in FIG. 1 and is supplied through a resistor 101 to a junction point 103. A capacitor 105 is connected between junction point 103 and ground 81. A variable capacitor, varactor or voltage controlled capacitance means 107 is connected between junction point 103 and a junction point 109. A recovered clock or clock input signal received on lead 36 is passed through a resistor 111 to junction point 109. Also, an inductance 113 is connected in parallel with resistor 111 to provide a wider range of time delay than can be obtained with the varactor 107 alone. A delay block 115 is connected between junction point 109 and a junction point 117. An isolation circuit in the form of an inverting OR gate 119 is connected between junction point 117 and a clock input of the D flip-flop 65. A further isolation circuit in the form of an OR gate 121 is connected between junction point 117 and a clock input of the latch 45. A final isolation circuit 123 is connected between junction point 109 and a clock input of the A/D converter 12 through a resistor 125.

Figure 3:
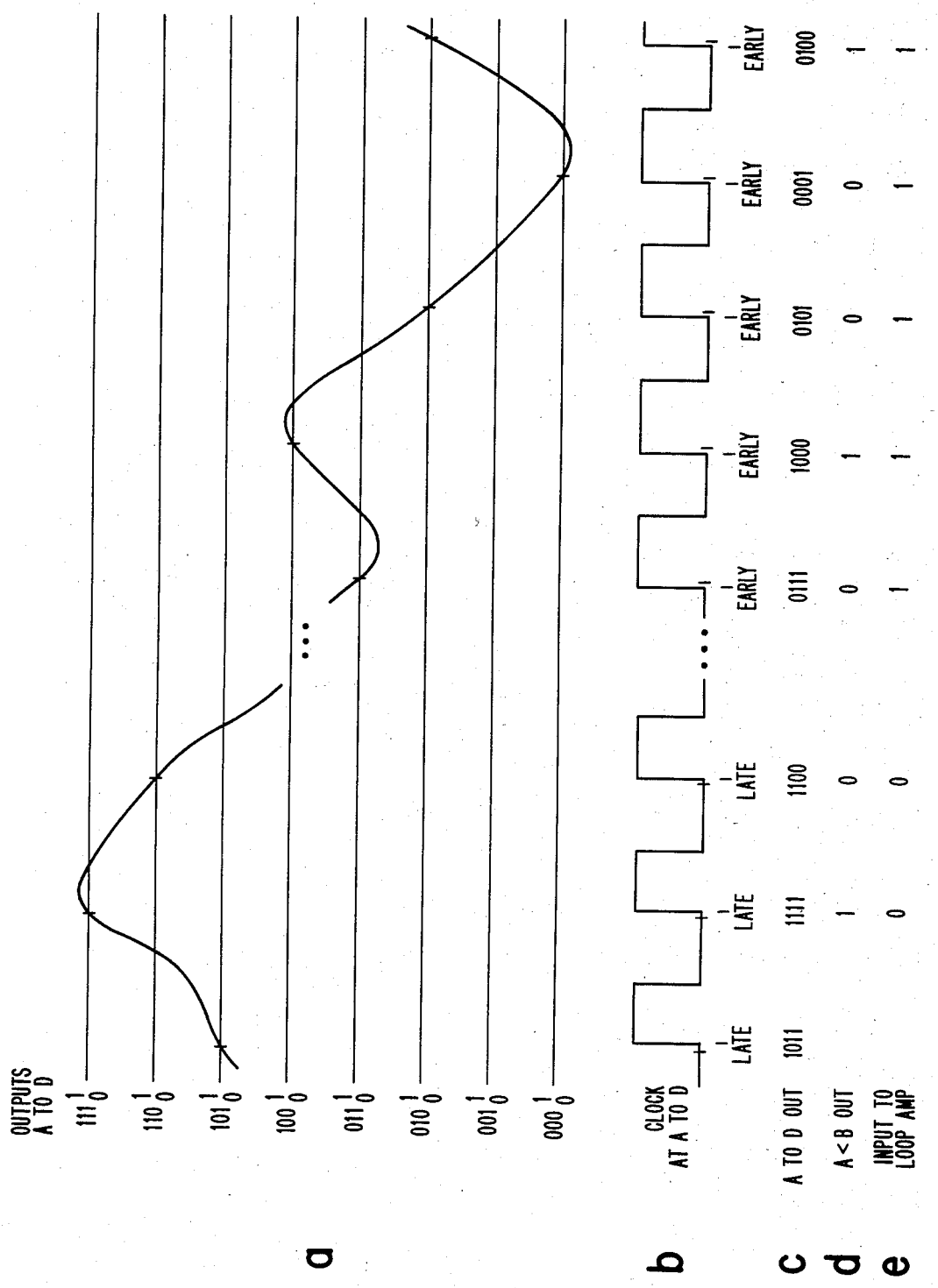

In FIG. 3 a first graph A illustrates an analog signal having values ranging from a digital word 000 to a digital word 1111. This signal is representative of the results of a quadrature phase amplitude modulation. If the signal is slightly higher than the top indicated line on the graph, it is converted to a digital word 1111. However, if it is slightly less, it is converted to the word 1110. The final digit of each byte or word is the error digit appearing on lead 20 of FIGS. 1 and 2. A break is shown between the left and righthand portions of the graph to show that there is a finite period of time between the occurrence of clocks occurring later than desirable and clocks occurring earlier than desirable. The waveform also contains vertical lines or ticks at the logic detection crossover point. This point represents the time of optimal clock occurrence to minimize errors in system operation. The waveform 3B illustrates the timing of occurrence of the clock signals with ticks corresponding in time to those in the waveform of FIG. 3A. FIG. 3C provides an indication of the converted output digital word appearing on the leads 14 through 20 of FIG. 1. FIG. 3D illustrates the polarity or logic value of the signal appearing on lead 24 at the output of the trajectory detection block 22. The signals in FIG. 3E indicate the logic value of the signal appearing at the output of the steering block 26 on lead 28. These signals are the ones that are integrated by integrator 30.

Figure 4:
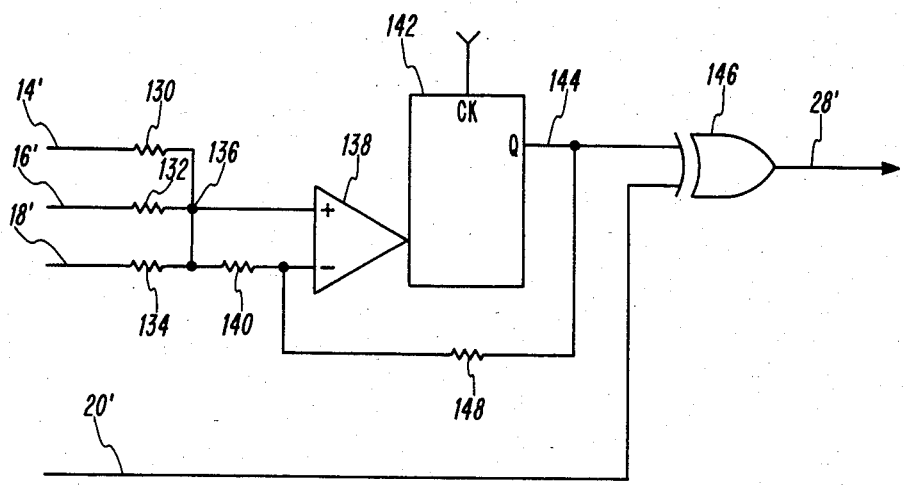

The alternate circuitry for providing the trajectory detection and steering information illustrated in FIG. 4, uses a ' (prime mark) for each of the same inputs as shown in previous figures. In other words, the signals to the left are obtained from the A/D converter. The signals on leads 14 through 18 are summed in resistors 130, 132 and 134 to a common junction point 136. Junction point 136 is connected to a non-inverting or positive input of an amplifier 138. The junction point 136 is also supplied through a summing resistor 140 to the inverting input of amplifier 138. An output of amplifier 138 is supplied to an input of a specialized latching comparator device 142 which supplies a logic 1 or 0 output indicating whether or not the present input is greater or less than the last received input. The output signal is supplied on a lead 144 to an exclusive OR gate 146 which receives a second input on lead 20'. Lead 144 is also connected through a resistor 148 to the inverting input of amplifier 138. The resistance means 140 and 148 provide a summing circuit in a feedback configuration. The output of exclusive OR gate 146 would function the same as lead 28 in FIG. 1 and is therefore given the designation 28'. Block 142 is a standard integrated circuit device and is given the designation 1650 and can be purchased from any of several manufacturers such as Motorola.

OPERATION

As previously indicated, the present inventive concept is used to optimize the clocking time of the A/D converter 12 of FIG. 1 towards a time which will convert a multilevel analog signal to a digital word output which is exactly representative of that analog input level. When the clock is at this point, the next most significant bit or error bit should be a logic 1 half the time and a logic 0 the other half of the time. If the clock is arriving slightly late, the error bit will always be a logic 1 when the analog signal is rising and will always be a logic 0 when the analog signal is falling. On the other hand, if the clock is early, the error bit will always be a logic 1 when the analog signal is falling and a logic 0 when the analog signal is rising. Close observation of the graph of FIG. 3A and the converted output presented on 3C will show the reader that this is true. By logically manipulating the data from the A/D converter, this information can be used to provide a signal to the integrator 30 which, when used with a voltage controlled capacitor, can control the delay of clock 36 to more or less than a set or standard delay value such that the arrival of the strobe on lead 38 can be optimized.

The logical manipulation occurs as a result of the observation by applicant that when the clock arrives later than optimal, the error bit is logic 1 when the slope is positive or rising and the error bit is a logic 0 when the slope is negative or falling. On the other hand, the slope is negative and the error bit is logic 1 when the clock is received early and when the slope is positive or rising, the error bit is a logic 0. By logically combining this information in a table, it has been ascertained by applicant that slope and error information can be exclusive ORed to generate either logical 1 or logical 0 values which can be used in an integration and feedback network to control a delay circuit for increasing or decreasing a variable delay of a clock signal to optimize the time at which the clock signal or strobe is applied at the A/D converter.

Keeping the above information in mind, it will be ascertained from an examination of FIGS. 2 and 3 that the latch circuit 45 provides an output of the present digital word on leads 47 through 51 and the previously received digital word on leads 55 through 59. The comparator 53 then provides an output on lead 24 which is a logic 1 whenever the present word is of a greater value than the previous word. This would indicate that there is a rising or positive slope to the analog signal received on lead 10. This signal is then exclusively ORed with the error bit signal appearing on lead 20 from the A/D converter 12. This error bit is the next most significant bit output by the converter relative the bits actually used for the output word to other circuitry utilizing the converted value. The signals on lead 24 are the same as those appearing in FIG. 3D while the signals on lead 20 are the rightmost bit of the digital words illustrated in FIG. 3C. The gap between the left and righthand portions of FIG. 3A to 3E illustrate a time difference separating the occurrence of late arriving clocks and early arriving clocks because the integrator 30 of this circuit has a very long time constant and the time of arrival of the strobe on lead 38 to A/D converter 12 does not change suddenly. In fact, the change illustrated would require several hundred clock cycles under normal circumstances after the feedback adjustment on lead 32 was held at a constant value.

The D flip-flop or latch circuit 65 passes the input signal to the integrator 30 on the actuation of the next clock. The connection of the two outputs Q and $\overline{Q}$ to the adjoining circuitry is merely used to provide temperature stabilization of a reference signal to the plus input of the operational amplifier 89 used in the integrator. Thus, the logic value from the $\overline{Q}$ output is not used at all for determining the direction that the integrator output will move. The output of the integrator 30 is applied across a varicap 107. In one embodiment of the invention, more than one varicap like 107 was used in parallel to increase the range but the concept is still identical. The clock input on lead 36 is thus delayed through the use of resistor 111, parallel inductance 113, one or more varicaps 107 and capacitor 105 to ground 81. This signal is further delayed and applied to D flip-flop 65 and the latch circuit 45 for the purpose of altering signal detection timing to increase the accuracy of the logical manipulation. The OR gate 123 is used for the purpose of further isolating the clock signal from the signal finally used as a strobe to actuate the A/D converter 12.

The circuit of FIG. 4 can be used to replace blocks 22 and 26 of FIG. 1 in the event that expense is not as important as physical layout space on the board. In other words, the circuitry for FIG. 4 is more expensive but occupies less physical space in a circuit and can be used where space is at a premium.

One embodiment of the inventive concept utilized additional logic circuitry in the steering circuit 26 to take care of the condition where the analog level remains the same for consecutive clock periods. Such a condition would produce an error signal at the output of integrator 30. However, this error signal condition was so small that the additional logic circuitry was deleted since the present circuit provides very adequate control of the strobe being returned to the A/D converter 12 under field conditions.

While I have illustrated two embodiments of the inventive concept, it will be apparent to those skilled in the art that other alterations may be made to the circuitry illustrated such as mentioned above for alterations in the steering circuit. I therefore wish to be limited not by the specific circuits illustrated, but only by the scope of the appended claims wherein I claim:

1. The method of dynamically delaying a clock signal to optimize the strobe point in the process of digitizing an analog signal comprising the steps of:
   A/D converting a multilevel analog signal which analog signal is level representative of a digital value to produce an N+1 bit digital word output signal;
   comparing the N most significant bits of the present and previous word values for ascertaining the slope of the analog signal;
   exclusive ORing the most significant bit, of the present digital word, not used in the comparison, with a given logic value when the present digital word value is greater than the previous digital word value;
   integrating the result of the exclusive ORing step; and
   variably delaying a clock signal in accordance with the results of the integrating to generate a strobe signal for initiating each A/D conversion.

2. Apparatus for dynamically delaying a clock signal to optimize the strobe point in the process of digitizing an analog signal comprising, in combination:
   conversion first means for A/D converting a multilevel analog signal which analog signal is level representative of a digital value to produce an N+1 bit digital word output signal;
   comparison second means, connected to said first means to receive said digital word output signal therefrom, for comparing the N most significant bits of the present and previous digital word values for ascertaining the slope of the analog signal, said second means generating an output logical signal indicative of the relative values of said present and previous digital words;
   OR gate third means, connected to said second means, for exclusive ORing the most significant bit, of the present digital word, that is not used in the comparison, with a given logic value when the present digital word value is greater than the previous digital word value;
   integration fourth means, connected to said third means for receiving logical output signals therefrom, for integrating the result of the exclusive ORing step;
   clock fifth means for supplying a clock signal;
   delay sixth means, connected to said fourth and fifth means for receiving signals therefrom, for variably delaying said clock signal in accordance with the results of the integrating to generate a strobe signal for initiating each A/D conversion; and
   connection seventh means connecting said sixth means to said first means for providing the strobe signal thereto.

3. Apparatus for optimizing the clock timing in a multilevel A/D conversion process comprising, in combination:
   signal supply first means for supplying an analog signal representing a plurality of discrete signal levels;
   clock signal second means for supplying a clock signal;
   analog-to-digital (A/D) third means, including input means connected to said first means for receiving said analog signal therefrom and including strobe signal input means, for converting received analog signal levels at times determined by a received strobe signal to digital output words indicative of said levels;
   analog signal trajectory detection fourth means, including input means connected to said third means for receiving said digital output words therefrom, for outputting a slope signal indicative of the level of the analog signal last converted by said third means as compared to the level previously converted;
   logic fifth means, connected to said third and fourth means for receiving signal therefrom, for detecting whether the conversion time of said third means is early or late relative predetermined signal level values and outputting a steering signal in accordance with said detecting;
   integration sixth means, connected to said fifth means for receiving said steering signal therefrom, for outputting an integrated signal;
   variable delay seventh means, connected to said second and sixth means for receiving clock and integrated signals therefrom, for outputting a timed delayed version of said clock as a strobe signal to said third means in accordance with said integrated signal.

4. The method of dynamically delaying a clock signal to optimize the strobe point in the process of digitizing a multilevel analog signal comprising the steps of:
   A/D converting a multilevel analog signal which analog signal is level representative of a digital value to produce an N bit digital word output signal and a one bit error signal;
   comparing the N most significant bits of the present and previous word values for generating a slope signal logically indicative of the slope of the analog signal;

exclusive ORing the one bit error signal with the slope signal;

integrating the result of the exclusive ORing step; and variably delaying a clock signal in accordance with the results of the integrating to generate a strobe signal for initiating each A/D conversion.

5. Apparatus for dynamically delaying a clock signal to optimize the strobe point in the process of digitizing a multilevel analog signal comprising, in combination:

A/D conversion first means for converting a multilevel analog signal which analog signal is level representative of a digital value to produce an N bit digital word output signal and a one bit error signal;

comparison second means, connected to said first means, for comparing the N most significant bits of the present and previous word values for generating a slope signal logically indicative of the slope of the analog signal;

logic third means, connected to said first and second means, for exclusive ORing the one bit error signal with the slope signal;

integration fourth means, connected to said third means, for integrating the result of the exclusive ORing step; and delay fifth means, connected to said fourth and first means, for variably delaying a clock signal in accordance with the results of the integrating to generate a strobe signal for initiating each A/D conversion.

* * * * *